(12) United States Patent
Larsson et al.

(10) Patent No.: US 7,989,060 B2
(45) Date of Patent: Aug. 2, 2011

(54) OXIDE COATED CUTTING INSERT

(75) Inventors: Tommy Larsson, Angelsberg (SE);
Mats Johansson, Linkoping (SE)

(73) Assignee: Seco Tools AB, Fagersta (SE)

( * ) Notice: Subject to any disclaimer, the term of this patent is extended or adjusted under 35 U.S.C. 154(b) by 147 days.

(21) Appl. No.: 12/399,466

(22) Filed: Mar. 6, 2009

(65) Prior Publication Data

US 2009/0226716 A1 Sep. 10, 2009

(30) Foreign Application Priority Data

Mar. 7, 2008 (SE) ....................................... 0800541

(51) Int. Cl.
*B23B 1/00* (2006.01)

(52) U.S. Cl. ............ 428/336; 51/307; 51/309; 428/697; 428/698; 428/699; 428/701; 428/702

(58) Field of Classification Search ..................... 51/307, 51/309; 428/336, 697, 698, 699, 701, 702, 428/704
See application file for complete search history.

(56) References Cited

U.S. PATENT DOCUMENTS

| 5,310,607 | A | 5/1994 | Schulz et al. | |
|---|---|---|---|---|
| 5,447,804 | A | 9/1995 | Schulz et al. | |
| 6,767,627 | B2 * | 7/2004 | Morikawa et al. | 428/336 |
| 7,273,665 | B2 * | 9/2007 | Hayahi et al. | 428/702 |
| 7,276,301 | B2 * | 10/2007 | Tsushima et al. | 51/307 |
| 2004/0202877 | A1 | 10/2004 | Martensson | |
| 2006/0263640 | A1 * | 11/2006 | Tamagaki et al. | 428/701 |
| 2007/0104945 | A1 | 5/2007 | Ruppi | |
| 2008/0090099 | A1 * | 4/2008 | Ramm et al. | 428/699 |

FOREIGN PATENT DOCUMENTS

| EP | 0659153 | A1 | 6/1995 |
|---|---|---|---|
| EP | 0744473 | B1 | 4/1996 |
| EP | 0603144 | B1 | 11/1996 |
| EP | 0659903 | A1 | 8/1998 |
| EP | 0738336 | B1 | 4/1999 |
| EP | 1528125 | B1 | 10/2004 |
| EP | 1477581 | A1 | 11/2004 |
| EP | 1479791 | B1 | 1/2008 |
| EP | 1655392 | B1 | 4/2008 |
| EP | 1655387 | B1 | 5/2008 |
| EP | 1655388 | B1 | 10/2008 |
| JP | 06-322517 | * | 11/1994 |
| JP | 2002-053946 | * | 2/2002 |

OTHER PUBLICATIONS

Ramm et al "Pulse enhanced electron emission (P3eTM) arc evaporation and the synthesis of wear resistant Al-Cr_O coatings in corundum structure" Suface & Coatings Technology 202 (2007) p. 876-883.*

(Continued)

*Primary Examiner* — Archene Turner
(74) *Attorney, Agent, or Firm* — Young & Thompson

(57) ABSTRACT

A cutting tool insert, particularly useful for machining of steel and stainless steel, comprising a body of a hard alloy of cemented carbide, cermet, ceramics, cubic boron nitride based material or high speed steel a hard and wear resistant coating; and at least $(Al,Cr)_2O_3$ layer applied to said body is disclosed. Methods of making a cutting tool insert are also disclosed. In addition, methods for machining of cast iron using the cutting tool inserts are disclosed.

19 Claims, 3 Drawing Sheets

OTHER PUBLICATIONS

Ramm et al "Thermal stability of thin film corundum-type solid solutions of (Al(1-x)Cr(x))2(O)3 synthesized under low temperature non-equilibrium" Advanced Engeering Materials 2007, 9, No. 7 p. 604-608.*

Viktorov et al "Fine structure of alpha-Al2O3-based solid solutions" Inorganic Materials, vol. 37, No. 10, 2001 p. 983-991.*

Witthaut et al "Prepartion of Cr2O3-Al2O3 solid solutions by reactive magnetron sputtering" Mikrochim Acta 133, 2000 p. 191-196.*

* cited by examiner

OXIDE COATED CUTTING INSERT

CROSS REFERENCE TO RELATED APPLICATIONS

This application claims priority to Swedish Application No. 0800541-5 filed Mar. 7, 2008, the entire disclosure of which is incorporated herein by reference.

FIELD OF THE INVENTION

This invention relates to tools for machining by chip removal. More specifically, the invention relates to cutting tool inserts comprising a body of a hard alloy of cemented carbide, cermet, ceramics, cubic boron nitride based material or high speed steel and a hard and wear resistant oxide designed to be used in machining of steels, preferably at high cutting speeds. The said coating is composed of one or more layers of which at least one layer is a textured physical vapor deposited (PVD) corundum phase alumina containing chromium $(Al,Cr)_2O_3$.

BACKGROUND OF THE INVENTION

Textured $\alpha$-$Al_2O_3$ layers, produced with chemical vapor deposition (CVD) is disclosed in, e.g., EP 603144, EP 1528125, EP 1477581, EP 659153, EP 1655387, EP 659903, EP 738336, EP 1655388, EP 1655392, US 2007/104945, US 2004/202877.

EP 1479791 discloses a cutting tool composed of cemented carbide or cermet, and a hard coating; wherein the hard coating includes an $\alpha$-$Al_2O_3$ layer formed by CVD, with the highest peak, measuring the inclination of the $\alpha$-$Al_2O_3$ basal planes relative to the normal of the surface within a range of 0-10 degrees as determined by electron back scattering diffraction (EBSD).

EP 744473 discloses textured $\gamma$-$Al_2O_3$ layers produced by PVD.

U.S. Pat. No. 5,310,607 discloses a hard coating including $(Al,Cr)_2O_3$ crystals and a chromium content higher than 5 at % wherein the $(Al,Cr)_2O_3$ is a single crystal. The coating is deposited at a temperature lower than 900° C. The hard coating is deposited by a CVD or PVD process.

When machining steels with an alumina coated cemented carbide tool, the cutting edge is worn according to different wear mechanisms, such as chemical wear, abrasive wear, adhesive wear and by edge chipping caused by cracks formed along the cutting edge. The domination of any of the wear mechanisms is determined by the application, and is dependent on properties of the machined material, applied cutting parameters and the properties of the tool material. In general, it is very difficult to improve all tool properties simultaneously, and commercial cemented carbide grades have usually been optimised with respect to one or few of the above mentioned wear types, and have consequently been optimised for specific application areas. This can, for instance, be achieved by controlling the texture of the alumina layer.

What is needed is a wear resistant and hard oxide coated cutting tool with enhanced performance for machining of steels and stainless steels. The invention is directed to these, as well as other, important needs.

SUMMARY OF THE INVENTION

Accordingly, the invention is directed to cutting tool inserts comprising a body of a hard alloy of cemented carbide, cermet, ceramics, cubic boron nitride based material or high speed steel comprising a textured oxide layer of corundum phase $(Al,Cr)_2O_3$ with excellent metal machining properties.

In one embodiment, the invention is directed to cutting tool inserts, comprising:

a body comprising a hard alloy selected from the group consisting of cemented carbide, cermet, ceramics, cubic boron nitride based material, and high speed steel; and a hard and wear resistant coating applied on said body;

wherein said coating comprises at least one $(Al,Cr)_2O_3$ layer;

wherein said $(Al,Cr)_2O_3$ layer has a corundum phase crystalline structure and a structure and a composition $(Al_{1-y},Cr_y)_2O_3$ with about $0.5 \leq y \leq$ about 0.7 with a thickness of about 0.5 μm to about 10 μm and a fiber texture, rotational symmetry, in the direction of the coated surface normal with an inclination angle, $\phi$, of the basal planes relative to the coated surface normal is about $0° < \phi <$ about 20° or the inclination angle, $\phi$, for the highest peak in the pole plot is about $0° < \phi <$ about 20°.

In other embodiments, the invention is directed to methods of making a cutting tool insert comprising:

a body comprising a hard alloy selected from the group consisting of cemented carbide, cermet, ceramics, cubic boron nitride based material, and high speed steel; and a hard and wear resistant coating applied on said body;

wherein said coating comprises at least one $(Al,Cr)_2O_3$ layer;

wherein said $(Al,Cr)_2O_3$ layer has a corundum phase crystalline structure and a structure and a composition $(Al_{1-y},Cr_y)_2O_3$ with about $0.5 \leq y \leq$ about 0.7 with a thickness of about 0.5 μm to about 10 μm and a fiber texture, rotational symmetry, in the direction of the coated surface normal with an inclination angle, $\phi$, of the basal planes relative to the coated surface normal is about $0° < \phi <$ about 20° or the inclination angle, $\phi$, for the highest peak in the pole plot is about $0° < \phi <$ about 20° said method comprising the step of:

depositing on said body said $(Al,Cr)_2O_3$ layer by cathodic arc evaporation using Al+Cr-cathodes with a composition of about (20 at % Al+80 at % Cr) and about (60 at % Al+40 at % Cr), an evaporation current between about 50 A and about 200 A depending on the cathode size in an atmosphere comprising a gas selected from the group consisting of Ar, $O_2$, and combinations thereof, at a total pressure of about 2.0 Pa to about 7.0 Pa, a bias of about −50 V to about −200 V, and a deposition temperature of about 500° C. and about 700° C.

In yet other embodiments, the invention is directed to methods for machining of steel and stainless steel, comprising the step of:

using a cutting tool insert described herein at a cutting speed of about 75-600 m/min, with an average feed, per tooth in the case of milling, of about 0.08-0.5 mm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Figure 1A:
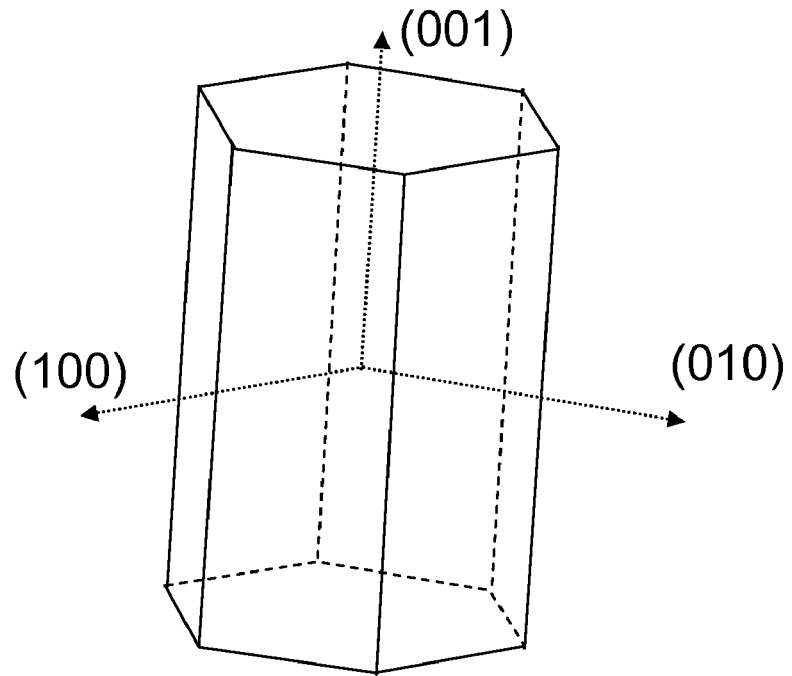
FIG. 1A shows a schematic view of the hexagonal crystal structure with the a-axis (100), b-axis (010) and c-axis (001) marked.
Figure 1B:
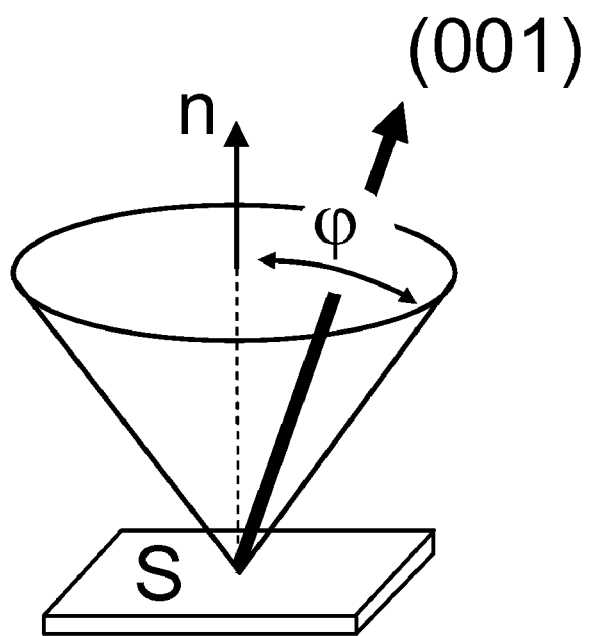
FIG. 1B shows a schematic view of the fibre texture with (S) coated surface, (φ) the inclination angle of the c-axis (001) of the hexagonal structure (FIG. 1A) and the normal (n) to the coating surface.
Figure 5:
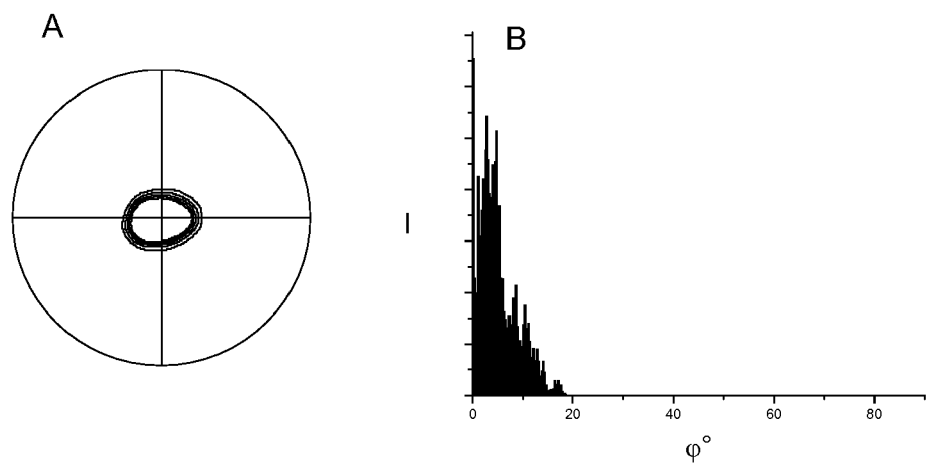
FIG. 5A shows (001) pole figure and FIG. 5B shows (001) pole plot graph of a $(Al,Cr)_2O_3$ layer according to the invention.

The invention is directed, in one aspect, to a cutting tool for machining by chip removal, particularly useful in metal cutting of steel and stainless steel, comprising a body of a hard alloy of cemented carbide, cermet, ceramics, cubic boron nitride based material or high speed steel onto which a coating is deposited comprising:

preferably a first (innermost) bonding layer (FIG. 3, layer B) of, e.g., TiN or (Al,Cr)N preferably less than about 0.5 μm according to prior art;

a layer of $(Al_{1-y}Cr_y)_2O_3$ with about $0.5 \leq y \leq$ about 0.7, preferably y is about 0.6, with a thickness of about 0.5-10 μm, preferably about 1-5 μm, most preferably about 2-4 μm, with textured columnar grains. The $(Al,Cr)_2O_3$ layer has a corundum structure formed by PVD and a fiber texture with rotational symmetry in the direction of the coated surface normal with an inclination angle, φ, (FIG. 1B) of the basal planes relative to the coated surface normal (FIG. 5A) or the inclination angle, φ, for the highest peak in the pole plot (FIG. 5B) with about 0°<φ<about 20°, preferably about 0°<φ<about 10° as determined by, e.g., electron back scattering diffraction (EBSD) or x-ray diffraction (XRD).

The (Al,Cr)O layer has a compressive stress level of about $-4.5<\sigma<$-about 0.5 GPa, preferably of about $-3.0<\sigma<$about $-1.0$ GPa.

The composition, y, of $(Al_{1-y}Cr_y)_2O_3$ is determined by, e.g., energy dispersive spectroscopy (EDS) or wavelength dispersive X-ray spectroscopy (WDS).

The body may further be coated with an inner single- and/or multilayer coating of, e.g. TiN, TiC, Ti(C,N), (Al,Cr)N or (Ti,Al)N, preferably (Ti,Al)N, (Al,Cr)N, and/or an outer single- and/or multilayer coating of, e.g. TiN, TiC, Ti(C,N), (Al,Cr)N or (Ti,Al)N, preferably (Ti,Al)N, (Al,Cr)N, to a total thickness, including the thickness of the $(Al,Cr)_2O_3$ layer, of about 1 to 20 μm, preferably about 1 to 10 μm and most preferably about 2 to 7 μm according to prior art.

The deposition method for the layer of the present invention is based on cathodic arc evaporation of an alloy or composite cathode under the following conditions; $(Al,Cr)_2O_3$ layers are grown using Al+Cr-cathodes with a composition between about (20 at % Al+80 at % Cr) and about (60 at % Al+40 at % Cr) and preferably between about (30 at % Al+70 at % Cr) and about (50 at % Al+50 at % Cr). The evaporation current is between about 50 A and about 200 A depending on the cathode size and preferably between about 60 A and about 90 A using cathodes of 63 mm in diameter. The layers are grown in an Ar+$O_2$ atmosphere, preferably in a pure $O_2$ atmosphere at a total pressure of about 2.0 Pa to about 7.0 Pa, preferably about 4.0 Pa to about 7.0 Pa. The bias is about −50 V to about −200 V, preferably about −50 V to about −100 V. The deposition temperature is between about 500° C. and about 700° C., preferably between about 600° C. and about 700° C.

The invention also relates to the use of cutting tool inserts according to the above for machining of steel and stainless steel at cutting speeds of about 75-600 m/min, preferably about 150-500 m/min, with an average feed, per tooth in the case of milling, of about 0.08-0.5 mm, preferably about 0.1-0.4 mm depending on cutting speed and insert geometry.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned hereunder are incorporated herein by reference. Unless mentioned otherwise, the techniques employed or contemplated herein are standard methodologies well known to one of ordinary skill in the art. The materials, methods, and examples are illustrative only and not limiting.

The present invention is further defined in the following Examples, in which all parts and percentages are by weight and degrees are Celsius, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

EXAMPLES

Example 1

Grade A: Cemented carbide inserts with the composition 10.3 wt % Co and balance WC, were used.

Figure 2:
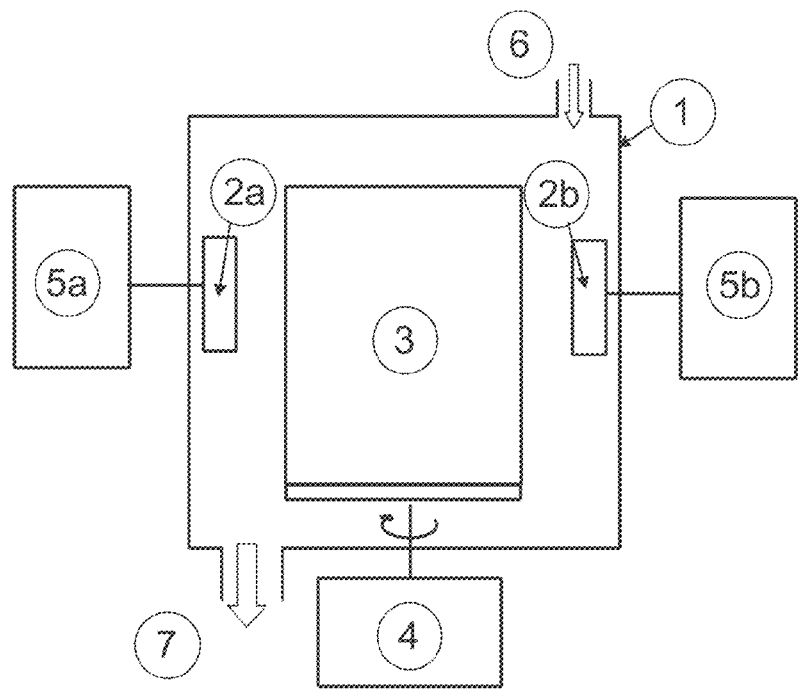
FIG. 2 shows a schematic side view of the deposition chamber showing (1) vacuum chamber, (2a) cathode material A, (2b) cathode material B, (3) fixture, (4) power supply for biasing, (5a) cathodic arc power supply (5b) cathodic arc power supply, (6) inlet for process gas and (7) outlet for vacuum pump.

Before deposition, the inserts were cleaned in ultrasonic baths of an alkali solution and alcohol. The system was evacuated to a pressure of less than $2.0 \times 10^{-3}$ Pa, after which the body were sputter cleaned with Ar ions. At first, a bonding layer of TiN with a thickness of 0.2 μm followed by a textured $(Al,Cr)_2O_3$ layer of thickness 2.5 μm, were grown by cathodic arc evaporation of an alloyed (40 at % Al+60 at % Cr) cathode, 63 mm in diameter (position (2a) and (2b) in FIG. 2A) in 99.995% pure $O_2$ atmosphere at a total pressure of 5.5 Pa and a deposition temperature of about 650° C. to a total coating thickness of 3 μm. The evaporation current was 75 A and the bias was held at −75 V during depositions. Finally, a top coating consisting of 0.3 μm (Al,Cr)N and 0.2 μm TiN was applied.

Figure 3:
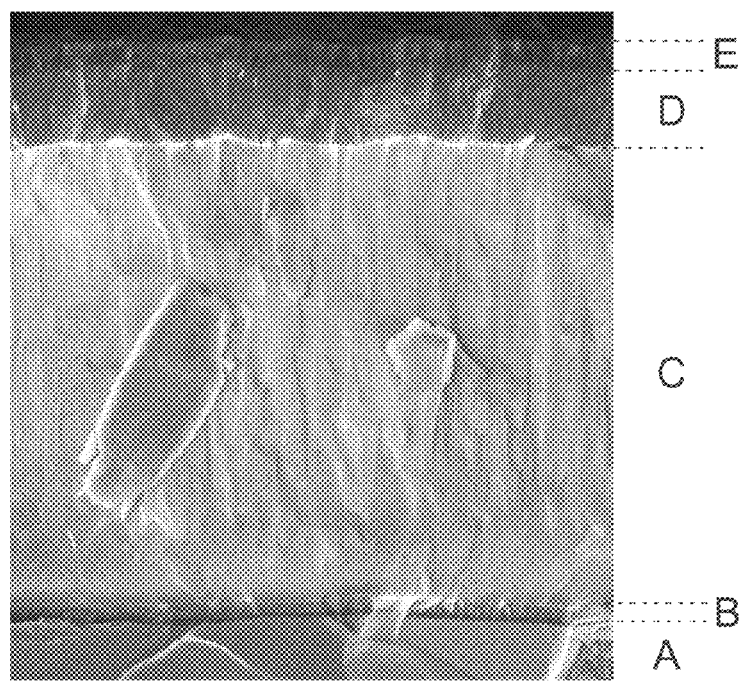
FIG. 3 shows a scanning electron micrograph in secondary mode of a fractured cross section of a coating according to the invention. (A) body, (B) bonding layer, (C) (Al,Cr)O layer, (D) (Al,Cr)N layer and (E) TiN layer.

A fractured cross-section SEM micrograph of the coating is shown in FIG. 3 with (A) body, (B) bonding layer, (C) (Al,Cr)O layer, (D) (Al,Cr)N layer and (E) TiN layer.

Figure 4:
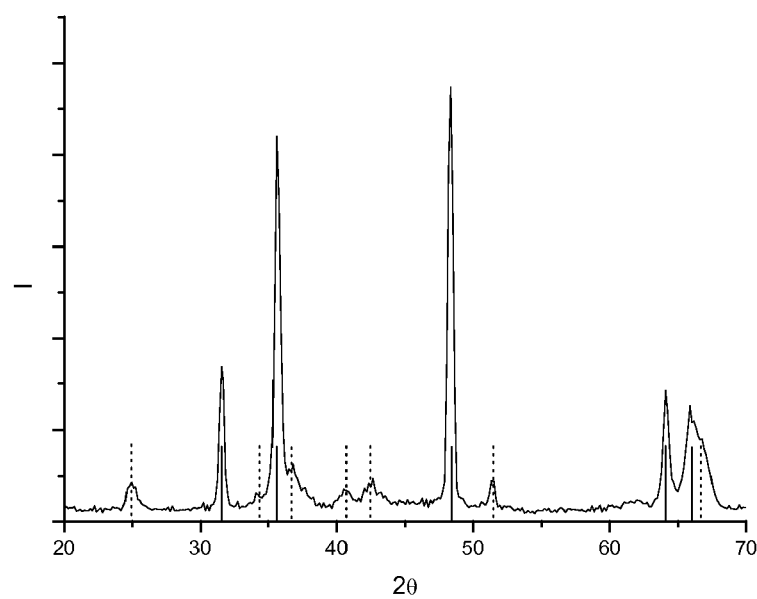
FIG. 4 shows an x-ray diffraction pattern of a textured $(Al,Cr)_2O_3$ layer. The peaks of cemented carbide are marked with solid lines whereas the peaks originating from $(Al,Cr)_2O_3$ with dashed lines.

The XRD patterns of the as-deposited layers were obtained using CuKα-radiation and a θ-2θ configuration. FIG. 4 shows the XRD pattern of a coating according to the invention with a textured corundum phase alumina $(Al,Cr)_2O_3$ layer. The peaks originating from the (Al,Cr)$_2$O$_3$ layer are marked with dashed lines whereas the peaks of cemented carbide are marked with solid lines.

The EBSD pole figure (FIG. 5A) and pole plot graph (FIG. 5B) of the as-deposited corundum phase (Al,Cr)$_2$O$_3$ layers in the c-axis (001) direction (FIG. 1A), respectively, showing a fiber texture (rotational symmetry) in the direction of the coated surface normal (FIG. 1B) with an inclination angle, $\phi$ (FIG. 1B), of the basal planes relative to the coated surface normal between 0 and 20°. The highest peak in the pole plot is close to 0°. The EBSD data were obtained using a LEO Ultra 55 scanning electron microscope operated at 20 kV equipped with a HKL Nordlys II EBSD detector and evaluated with the Channel 5 software.

The residual stress, $\sigma$, of the (Al,Cr)$_2$O$_3$ coating was evaluated by XRD measurements using the $\sin^2 \psi$ method. The measurements were performed using CrK$\alpha$-radiation on the (Al,Cr)$_2$O$_3$ (116)-reflection. The residual stress value was 2.1±0.2 GPa as evaluated using a Poisson's ratio of v=0.26 and Young's modulus of E=420 GPa.

The composition, y=0.49, of (Al$_{1-y}$Cr$_y$)$_2$O$_3$ was estimated by energy dispersive spectroscopy (EDS) analysis using a LEO Ultra 55 scanning electron microscope with a Thermo Noran EDS detector operating at 10 kV. The data were evaluated using a Noran System Six (NSS ver 2) software.

Example 2

Grade B: A layer of 3.0 μm Ti$_{0.34}$Al$_{0.66}$N was deposited by PVD on cemented carbide inserts with the composition 10.3 wt % Co and balance WC, according to prior art.

Example 3

Grade C: A coating consisting of 3.0 μm Ti(C,N)+3 μm $\alpha$-Al$_2$O$_3$ was deposited by CVD on cemented carbide inserts with the composition 10.3 wt % Co and balance WC, according to prior art.

Example 4

Grade D: Example 1 was repeated using cemented carbide inserts with the composition 5.3 wt % Co and balance WC.

Example 5

Grade E: A layer of 3.0 μm Ti$_{0.34}$Al$_{0.66}$N was deposited by PVD on cemented carbide inserts with the composition 5.3 wt % Co and balance WC, according to prior art.

Example 6

Grade F: A coating consisting of 3.0 μm Ti(C,N)+3 μm $\alpha$-Al$_2$O$_3$ was deposited by CVD on cemented carbide inserts with the composition 5.3 wt % Co and balance WC, according to prior art.

Example 7

Grades A, B and C were tested in machining in steel.

| Operation | Face milling |
| --- | --- |
| Cutter diameter | 125 mm |
| Material | SS1672 |
| Insert type | SEEX1204AFTN-M15 |
| Cutting speed | 300 m/min |
| Feed | 0.2 mm/tooth |
| Depth of cut | 2.5 mm |
| Width of cut | 120 mm |
| Results | Tool life (min) |
| Grade A (grade according to invention) | 7.4 |
| Grade B | 6.2 |
| Grade C | 3.3 |

The test was stopped at the same maximum flank wear. The wear resistance was much improved with the grade according to the invention.

Example 8

Grades A, B and C were tested in machining in stainless steel.

| Operation | Shoulder milling |
| --- | --- |
| Cutter diameter | 32 mm |
| Material | SS1672 |
| Insert type | XOEX120408-M07 |
| Cutting speed | 275 m/min |
| Feed | 0.25 mm/tooth |
| Depth of cut | 3 mm |
| Width of cut | 8.8 mm |
| Results | Tool life (min) |
| Grade A (grade according to invention) | 6.2 |
| Grade B | 4.1 |
| Grade C | failed |

The test was stopped at the same maximum flank wear. The wear resistance was much improved with the grade according to the invention.

Example 9

Grades D, E and F were tested in machining in stainless steel.

| Operation | Interrupted turning |
| --- | --- |
| Material | SS2348 |
| Insert type | CNMG120408-MR3 |
| Cutting speed | 80 m/min |
| Feed | 0.3 mm |
| Depth of cut | 2 mm |
| Results | Tool life (cycles) |
| Grade D (grade according to invention) | 7 |
| Grade E | 2 |
| Grade F | 5 |

The test was stopped at the same maximum flank wear. The wear resistance was much improved with the grade according to the invention.

Example 10

Grades D, E and F were tested in machining in stainless steel.

| Operation | Interrupted turning |
| --- | --- |
| Material | SS1672 |
| Insert type | CNMG120408-MR3 |
| Cutting speed | 350 m/min |
| Feed | 0.3 mm |
| Depth of cut | 2 mm |
| Results | Tool life (min) |
| Grade D (grade according to invention) | 11.1 |
| Grade E | 4.5 |
| Grade F | 9.2 |

The test was stopped at the same maximum flank wear. The wear resistance was much improved with the grade according to the invention.

When ranges are used herein for physical properties, such as molecular weight, or chemical properties, such as chemical formulae, all combinations and subcombinations of ranges specific embodiments therein are intended to be included.

The disclosures of each patent, patent application, and publication cited or described in this document are hereby incorporated herein by reference, in their entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert, comprising:
   a body comprising a hard alloy selected from the group consisting of cemented carbide, cermet, ceramics, cubic boron nitride based material, and high speed steel; and
   a hard and wear resistant coating applied on said body;
   wherein said coating comprises at least one $(Al,Cr)_2O_3$ layer;
   wherein said $(Al,Cr)_2O_3$ layer has a corundum phase crystalline structure and a structure and a composition $(Al_{1-y}Cr_y)_2O_3$ with about $0.5 \leq y \leq$ about 0.7 with a thickness of about 0.5 μm to about 10 μm and a fiber texture, rotational symmetry, in the direction of the coated surface normal with an inclination angle, $\phi$, of the basal planes relative to the coated surface normal is about $0° < \phi <$ about 20° or the inclination angle, $\phi$, for the highest peak in the pole plot is about $0° < \phi <$ about 20°.

2. A cutting tool insert according to claim 1,
   wherein y is about 0.6; and
   wherein said thickness of said $(Al,Cr)_2O_3$ layer is about 1 μm to about 5 μm.

3. A cutting tool insert according to claim 1,
   wherein said inclination angle, $\phi$, of the basal planes relative to the coated surface normal is about $0° < \phi <$ about 10°.

4. A cutting tool insert according to claim 1,
   wherein said $(Al,Cr)_2O_3$ layer has a residual stress of about $-4.5 < \sigma <$ about $-0.5$ GPa.

5. A cutting tool insert according to claim 1,
   wherein said $(Al,Cr)_2O_3$ layer has a residual stress of about $-3.0 < \sigma <$ about $-1.0$ GPa.

6. A cutting tool insert according to claim 1,
   wherein said $(Al,Cr)_2O_3$ layer has been deposited with physical vapor deposition (PVD).

7. A cutting tool insert according to claim 1,
   wherein said $(Al,Cr)_2O_3$ layer has been deposited with cathodic arc evaporation.

8. A cutting tool insert according to claim 1,
   wherein said body is optionally coated with an inner single- or multilayer coating of at least one material selected from the group consisting of TiN, TiC, Ti(C,N), (Al,Cr)N, and (Ti,Al)N; and
   wherein said body is optionally coated with an outer single- or multilayer coating of at least one material selected from the group consisting of TiN, TiC, Ti(C,N), (Al,Cr)N, and (Ti,Al)N.

9. A cutting tool insert according to claim 8,
   wherein said body is coated with an inner single- or multilayer coating of (Ti,Al)N or (Al,Cr)N.

10. A cutting tool insert according to claim 8,
    wherein said body is coated with an outer single- or multilayer coating of (Ti,Al)N or (Al,Cr)N.

11. A cutting tool insert according to claim 8,
    wherein the total coating thickness of said inner coating, said outer coating, and said $(Al,Cr)_2O_3$ layer is about 1 μm to about 20 μm.

12. A cutting tool insert according to claim 8,
    wherein the total coating thickness of said inner coating, said outer coating, and said $(Al,Cr)_2O_3$ layer is about 1 μm to about 10 μm.

13. A cutting tool insert, comprising:
    a body comprising a hard alloy selected from the group consisting of cemented carbide, cermet, ceramics, cubic boron nitride based material, and high speed steel; and
    a bonding layer, a hard and wear resistant $(Al,Cr)_2O_3$ layer and a top coating consecutively applied on said body;
    wherein said $(Al,Cr)_2O_3$ layer has a corundum phase crystalline structure and a structure and a composition $(Al_{1-y}Cr_y)_2O_3$ with about $0.5 \leq y \leq$ about 0.7 with a thickness of about 0.5 μm to about 10 μm and a fiber texture, rotational symmetry, in a direction of the coated surface normal with an inclination angle, $\phi$, of basal planes relative to a coated surface normal is about $0° < \phi <$ about 20° or the inclination angle, $\phi$, for a highest peak in a pole plot is about $0° < \phi <$ about 20°.

14. A cutting tool according to claim 13, wherein the bonding layer comprises 0.2 μm thick TiN.

15. A cutting tool according to claim 13, wherein the top coating comprises 0.3 μm thick (Al,Cr)N and 0.2 μm thick TiN.

16. A cutting tool insert according to claim 13,
    wherein y is about 0.6; and
    wherein said thickness of said $(Al,Cr)_2O_3$ layer is about 1 μm to about 5 μm.

17. A cutting tool insert according to claim 13,
    wherein said inclination angle, $\phi$, of the basal planes relative to the coated surface normal is about $0° < \phi <$ about 10°.

18. A cutting tool insert according to claim 13,
    wherein said $(Al,Cr)_2O_3$ layer has a residual stress of about $-4.5 < \sigma <$ about $-0.5$ GPa.

19. A cutting tool insert according to claim 13,
    wherein said $(Al,Cr)_2O_3$ layer has a residual stress of about $-3.0 < \sigma <$ about $-1.0$ GPa.

* * * * *